United States Patent [19]
Urasaki et al.

[11] Patent Number: 5,879,568
[45] Date of Patent: Mar. 9, 1999

[54] PROCESS FOR PRODUCING MULTILAYER PRINTED CIRCUIT BOARD FOR WIRE BONDING

[75] Inventors: Naoyuki Urasaki; Kouichi Tsuyama, both of Shimodate; Kazuhito Kobayashi, Yuki; Norio Okano, Tsukuba; Hiroshi Shimizu, Shimodate; Nobuyuki Ogawa, Tsukuba; Akishi Nakaso, Oyama; Toyoki Ito, Shimodate; Daisuke Fujimoto, Shimodate; Kazuhisa Otsuka, Shimodate; Shigeharu Arike, Tochigi-ken; Yoshiyuki Tsuru, Shimodate, all of Japan

[73] Assignee: Hitachi, Ltd., Tokyo, Japan

[21] Appl. No.: 870,379

[22] Filed: Jun. 6, 1997

[30] Foreign Application Priority Data

Jun. 18, 1996 [JP] Japan ..................................... 8-156780
Oct. 31, 1996 [JP] Japan ..................................... 8-289400

[51] Int. Cl.⁶ ....................................................... B44C 1/22
[52] U.S. Cl. ................................ 216/18; 216/20; 216/34; 216/65
[58] Field of Search ................................. 216/13, 18, 20, 216/34, 39, 65, 105; 427/97; 29/852

[56] References Cited

U.S. PATENT DOCUMENTS

| | | | |
|---|---|---|---|
| 4,943,346 | 7/1990 | Mattelin | 216/65 X |
| 5,263,243 | 11/1993 | Taneda et al. | 216/65 X |
| 5,567,329 | 10/1996 | Rose et al. | 216/65 X |
| 5,651,899 | 7/1997 | Schmidt et al. | 216/18 |

FOREIGN PATENT DOCUMENTS

A 4-338695  11/1992  Japan .
A 6-260760   9/1994  Japan .

*Primary Examiner*—William Powell
*Attorney, Agent, or Firm*—Antonelli, Terry, Stout & Kraus, LLP

[57] ABSTRACT

A multilayer printed circuit board small in interlayer thickness, capable of fine wiring, minimized in IVH and BVH diameters, high in strength and also excellent in wire bonding workability can be produced by a process comprising the steps of coating a thermosetting resin varnish compounded with electrically insulating whiskers on a roughened side of a copper foil, semi-curing the resin by heating to form a thermosetting resin layer, integrally laminating it on an interlayer board in which plated through-holes and conductor circudits have been formed, and roughening the cured thermosetting resin layer on the via hole wall surfaces with a roughening agent.

8 Claims, 2 Drawing Sheets

PROCESS FOR PRODUCING MULTILAYER PRINTED CIRCUIT BOARD FOR WIRE BONDING

BACKGROUND OF THE INVENTION

The present invention relates to a process for producing multilayer printed circuit board suited for wire bonding.

With a steady trend toward smaller size, higher performance and functional diversification of electronic appliances, the necessity for higher wiring density of multilayer printed circuit boards has intensified. In order to answer to this request, various attempts and improvements have been made, such as reduction of interlayer thickness, formation of fine wiring and diminishment of diameter of the interlaminar connecting holes. It has been also proposed and practiced to form interstitial via holes (IVH), which connect the adjoining interlaminar conductors alone, and beried via holes (BVH), and attempts are being made to further reduce the diameter of these IVH and BVH.

There are known two types of multilayer circuit boards: a type in which a plurality of circuit layers and interposed insulating layers are integrally laminated by hot pressing and electrically connected by forming holes at the necessary parts; and a built-up layer type in which circuit layers and insulating layers are formed alternately to constitute a built-up structure with the holes being formed at the necessary locations.

In a typical example of said built-up multilayer circuit board, plated through-holes in the interlayer circuit board having said through-holes and interlayer circuits therein are filled with a thermosetting resin by a proper means such as silk screen printing so that the holes will be perfectly closed, then the resin is cured by heating, and after removing the resin which has run out from the holes by suitable means such as polishing, a thermosetting resin is applied on the board and cured by heating to form an insulating layer, with the pertinent portions of this insulating layer being removed to provide the holes for interlaminar connection. Then the inner walls of these holes are metallized by plating or other means and the circuit conductors are formed on the insulating layers, followed by formation of the circuits thereon. By conducting the above operation on said interlayer cirucit board, it is possible to form another lamination of insulating layer and circuit layer, and by repeating this operation, there can be formed the desired multilayer circuits.

Such a built-up type multilayer circuit board tends to suffer a reduction of strength for the following reason. In the ordinary circuit boards, since a prepreg comprising a glass cloth impregnated with an epoxy resin or the like is used, the strength of the insulating layers can be maintained by incorporating a reinforcing material in the glass cloth, but in the case of the built-up multilayer circuit boards, no such reinforcement is used for facilitaing formation of the insulating layers by silk screen printing or formation of the holes for interlaminar connections. When attention is given only to the essential function of a circuit board, it seems that the above problem of low strength can be easily overcome by such means as adopting the above circuit board structure only at the sections where no high strength is required or providing a separate reinforcing sheet. Actually, however, it is often required to mount semiconductor devices with narrow terminal intervals or to mount the semiconductors themselves on the circuit board which is required to have a high wiring density, so that it is necessary to provide a base that guarantees a good balance of the semiconductors with the mechanical properties of the board and secure wire bonding used for direct mounting of the semiconductor parts.

SUMMARY OF THE INVENTION

The present invention is envisioned to provide a process for producing a multilayer printed circuit board which is small in interlayer thickness, capable of forming fine wiring and reducing the diameters of IVH and BVH, high in strength and also excellent in wire bonding workability.

The present invention provides a process for producing a multilayer printed circuit board convenient for wire bonding, which comprises:

(a) a step of compounding electrically insulating ceramic whiskers into a thermosetting resin varnish, dispersing the whiskers in the thermosetting resin uniformly by stirring, coating the resulting mixture on the roughened side of a copper foil, semi-curing the thermosetting resin by heating to form a thermosetting resin layer, placing this thermosetting resin layer on an interlayer circuit board in which the plated through-holes and conductor circuits have already been formed, and hot pressing them to form an integral laminate;

(b) a step of forming an etching resist on said copper foil, and etching the copper foil portions exposed from the etching resist into the shape of holes for forming interstitial via holes (IVH);

(c) a step of removing the etching resist;

(d) a step of applying laser beams to the cured thermosetting resin layer exposed from the fine holes of the copper foil etched into the shape of holes for forming IVH to remove the resin layer to the extent that the circuit conductors of the interlayer circuit board are exposed out, thereby forming the via holes;

(e) a step of roughening the cured thermosetting resin layer on the via hole wall surfaces with a roughening agent;

(f) a step of carrying out plating for electrically connecting the circuit conductors of said interlayer board to said copper foil;

(g) a step of forming an etching resist on said copper foil, and etching the copper foil portions exposed from said etching resist; and (h) a step of removing said etching resist.

The above steps (a)–(h) may be repeated a desired number of times to form the via holes of two or more layers.

DESCRIPTION OF THE PREFERRED EMBODIMENTS

Figure 1A:
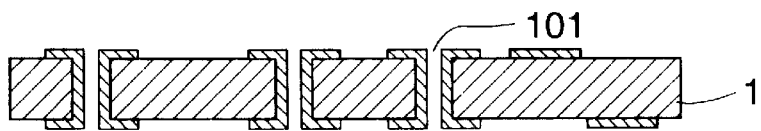
FIGS. 1A, 1B, 1C, 1D, 1E, 1F, 1G, 1H and 1I are the schematic sectional illustrations of the sequential steps in an example of the process according to the present invention.

The process for producing a multilayer printed circuit board for wire bonding according to the present invention is characterized in that the following steps (a)–(h) are carried out in this order:

(a) a step of compounding the electrically insulating ceramic whiskers into a thermosetting resin varnish, dispersing said whiskers in said varnish uniformly by stirring, coating the resulting mixture on the roughened side of a copper foil, semi-curing the resin by heating to form a thermosetting resin layer, placing this layer on an interlayer circuit board in which the plated through-holes and conductor circuits have been formed, and hot pressing them to form an integral laminate;

(b) a step of forming an etching resist on said copper foil and etching the copper foil portions exposed from the etching resist into the shape of holes for forming IVH;

(c) a step of removing the etching resist;

(d) a step of applying laser beams to the thermosetting resin layer exposed from the fine holes of the copper foil etched into the shape of holes for forming IVH to remove the resin layer to the extent that the circuit conductors in the interlayer circuit board are exposed out, thereby forming the via holes;

(e) a step of roughening the cured thermosettig resin layer on the via hole wall surfaces by a roughening agent;

(f) a step of conducting plating for electrically connecting the circuit conductors in the interlayer circuit board to said copper foil;

(g) a step of forming an etching resist on said copper foil and etching away the copper foil portions exposed from the etching resist; and (h) a step of removing the etching resist.

The step (a) may be subjected to various modifications. Also, the steps (a)–(h) may be repeated a desired number of times to form the via holes of two or more layers.

The materials used in the above process and the respective steps are described in detail below.

(Thermosetting resin)

In the present invention, it is possible to use various types of thermosetting resins, but the present invetnion is specifically characterized in that the resins having no film-forming ability per se can be used.

The term "film-forming ability" of the resin used in the present specification means resin characteristics of being easy to control coating thickness when a varnish prepared by dissolving the resin in a solvent is coated on a carrier film, and of being resistant to cracking and proof against loss during transport, cutting and lamination of the hot dried semi-cured resin, and the capability of the resin to secure the minimum thickness of the insulating layer at the time of hot press molding.

The thermosetting resins usable in the present invention include the resins which are conventionally used as an impregnant of glass cloth, for example, the resins whose molecular weight does not exceed 30,000, such as epoxy resins, bistriazine resins, polyimide resins, phenol resins, melamine resins, silicone resins, unsaturated polyester resins, cyanic ester resins, isocyanate resins, and modified resins thereof. Of these resins, epoxy resins, bistriazine resins and polyimide resins are preferred because of high Tg, modulus of elasticity and hardness.

The epoxy resins usable in this invention include bisphenol F epoxy resins, bisphenol S epoxy resins, cresol novolak epoxy resins, bisphenol A novolak epoxy resins, salicylaldehyde novolak epoxy resins, bisphenol F novolak epoxy resins, alicyclic epoxy resins, glycidyl ester epoxy resins, glycidylamine epoxy resins, hydantoin epoxy resins, isocyanurate epoxy resins, aliphatic cyclic epoxy resins, and their halides and hydrogenated products. These resins may be used in combination. Of these resins, bisphenol A novolak epoxy resins and salicylaldehyde novolak epoxy resins are preferred because of high heat resistance.

(Electrically insualting ceramic whiskers)

The electrically insulating ceramic whiskers used in the present invention are preferably those having a modulus of elasticity of 200 MPa or above. The whiskers having a modulus of elasticity of less than 200 MPa tend to lack rigidity and may be unable to provide a desired adaptability to wire bonding.

The electrically insulating ceramic whiskers usable in the present invention include, for example, aluminum borate, wallastonite, potassium titanate, basic magnesium sulfate, silicon nitride and $\alpha$-alumina. Aluminum borate and potassium titanate whiskers are preferred as they are almost equal to conventional E glass in Mohs hardness and allow obtainment of the wire bonding adaptability equal to that of the conventional prepregs. Aluminum borate whiskers are especially preferred because of high modulus of elasticity (400 MPa) and easy miscibility with varnishes.

As for the size of these electrically insulating ceramic whiskers, it is desirable that their average diameter is 0.3–3 $\mu$m and their average length is at least 5 times the average diameter. When the average diameter is less than 0.3 $\mu$m, the whiskers are hard to mix with the resin varnish, and when the average diameter exceeds 3 $\mu$m, dispersion of the whiskers in the resin tends to become insufficient, resulting in the increased unevenness of the coating surface. The average diameter of the whiskers, therefore, is preferably in the range from 0.3 to 1 $\mu$m.

When the average length of the whiskers is less than 5 times the average diameter, the desired rigidity of the board may not be obtained. The average length is more preferably 20 times or more the average diameter. It is also recommended to set the upper limit of the average length of the whiskers at 100 $\mu$m or below because the average length of the whiskers needs to be smaller than the intervals of the interlayer circuits and there is presently available no circuit board in which the interlayer circuit intervals are less than 100 $\mu$m. If the average length of the whiskers is greater than the intervals of the interlayer circuits, there tends to take place migration of copper ions along the electrically insulating ceramic whiskers when they contact both circuits, which has high probability of causing short-circuiting.

In order to enhacne wettability of the electrically insulating ceramic whiskers with the thermosetting resins, it is desirable to use the whiskers surface-treated with a coupling agent. As the coupling agent, there can be used conventional coupling agents such as silicone series, titanium series, aluminum series, zirconium series, zirco-aluminum series, chrome series, boron series, phosphorus series and amino series.

(Curing agent)

As the curing agent for the thermosetting resins in the present invention, there can be used any of those usable for the above-mentioned resins. In the case of epoxy resins, for example, there can be used dicyandiamide, bisphenol A, bisphenol F, polyvinyl phenol, phenol novolak resin, bisphenol A novolak resin, and their halides. Bisphenol A novolak resin is especially preferred because of high heat resistance.

The mixing ratio of the curing agent to the thermosetting resin is preferably in the range of 2 to 100 parts by weight per 100 parts by weight of the resin. In the case of dicyandiamide, the mixing ratio is preferably 2 to 5 parts by weight, and in the case of other curing agents, the mixing ratio is preferably 30 to 80 parts by weight, per 100 parts by weight of the resin. When the mixing ratio is less than 2 parts by weight, insufficient curing tends to result, causing a reduction of heat resistance of the resin, while use of the curing agent in excess of 80 parts by weight tends to cause deterioration of the electrical properties and heat resistance of the resin.

(Curing accelerator)

In the present invention, it is desirable to add a curing accelerator to the mixture of a thermosetting resin and a curing agent. As the curing accelerator, there can be used imidazole compounds, organic phosphorus compounds, tertiary amines, quaternary ammonium salts and the like in case the thermosetting resin is an epoxy resin.

The curing accelerator is preferably used in an amount of 0.01 to 20 parts by weight, more preferably 0.1 to 1.0 part by weight, per 100 parts by weight of the resin. When its amount is less than 0.01 part by weight, curing of the resin may become insufficient, resulting in reduced heat resistance of the resin, while use of the curing accelerator in excess of 20 parts by weight may shorten the life of the B stage resin to cause a reduction of heat resistance.

(Solvent)

In the present invention, the thermosetting resin, electrically insulating ceramic whiskers, curing agent and curing accelerator are used after diluted with a solvent. The solvents usable for this purpose include acetone, methyl ethyl ketone, toluene, xylene, methyl isobutyl, ethyl acetate, ethylene glycol monomethyl ether, methanol, ethanol, N,N-dimethylformamide, N,N-dimethylacetamide and the like.

The diluent (solvent) can be used in an amount of preferably 1 to 200 parts by weight, more preferably 30 to 100 parts by weight, per 100 parts by weight of the resin. When the diluent amount is less than 1 part by weight, the viscosity of the mixed solution becomes too high to perform uniform coating, and when the diluent amount exceeds 200 parts by weight, the viscosity of the mixed solution becomes too low to perform coating to a desired thickness.

(Proportion of whiskers to resin)

The proportion of the electrically insulating ceramic whiskers to the thermosetting resin is preferably so adjusted that the whiskers will be present in a ratio of 5 to 50 vol %, more preferably 20 to 40 vol %, in the cured resin. When the ratio of whiskers is less than 5 vol %, the film forming properties of the resin are unsatisfactory and also the resin becomes difficult to handle and involves the possibility of scattering during cutting. Also, the rigidity of the produced board proves low and the wire bonding workability is deteriorated. On the other hand, when the whiskers ratio exceeds 50 vol %, resin filling of the holes in the interlayer circuit board or resin filling of the circuit interstices becomes insufficient during hot press molding in the above-described step (a) or in the below-described step (a1) or (a3) which are the substitutes for the step (a), causing formation of voids and thin spots in the molding and a reduction of insulating performance of the molded product.

The steps in the process for producing a multilayer printed circuit board according to the present invention are discussed more particularly below.

Step (a)

This is a step of compounding electrically insulating ceramic whiskers into a thermosetting resin, dispersing the whiskers in the thermosetting resin uniformly by stirring, coating the resulting mixture on the roughened side of a copper foil, semi-curing the thermosetting resin by heating to form a thermosetting resin layer, placing this resin layer on an interlayer circuit board in which the plated through-holes and conductor circuits have been formed, and hot pressing them to form an integral laminate.

For coating a mixture of the thermosetting resin and electrically insulating ceramic whiskers on a copper foil in the above step, the electrically insulating ceramic whiskers are mixed in a solution comprising said thermosetting resin, curing agent, curing accelerator and diluent (this solution being called thermosetting resin varnish) and stirred, and resulting varnish is coated on the copper foil and semi-cured by heating. Coating can be accomplished by using a conventional coating means such as blade coater, rod coater, knife coater, squeeze coater, reverse roll coater, transfer roll coater, etc. It is desirable to employ a coating method in which the sharing force is loaded in the direction parallel to the copper foil or the compressive force is loaded in the direction vertical to the copper foil plane.

The resin flow of said thermosetting resin varnish determined by the method described below is preferably 500 $\mu$m or above, and the thickness of the thermosetting resin layer after semi-cured is preferably in the range from 25 to 100 $\mu$m. The "resin flow" signifies the minimum distance of flow of the resin which has run out from the edges of the 30 mm square holes to the copper foil surface when a copper-foiled prepreg with a resin thickness of 50 $\mu$m and having the 30 mm square holes formed therein was layered on a copper-clad laminate so that the resin would face the copper foil side of said laminate, and then hot pressed at 170° C. under 2.5 MPa for 60 minutes for lamination.

This resin flow is preferably adjusted to be in the range from 500 $\mu$m to 10 mm. When it is less than 500 $\mu$m, embedding of the interlayer copper foil is unsatisfactory, causing surface unevenness of the produced board, and when the resin flow exceeds 10 mm, the ends of the laminate are too small in thickness, resulting in reduced insulating performance.

Steps (a1) and (a2)

(a1) is a step of compounding the electrically insulating ceramic whiskers in a thermosetting resin, dispersing the whiskers in the resin uniformly by stirring, coating the resulting mixture on the roughened surface of the copper layer of a composite metal foil composed of a circuit-forming copper layer having an appropriate roughness for bonding with the resin and a carrier layer having a sufficient strength for handling as a metal layer as a whole, said two layers being easily separable from each other, semi-curing the resin by heating to form a thermosetting resin layer, placing this thermosetting resin layer on an interlayer board in which the plated through-holes and conductor circuits have been formed, and hot pressing them to form an integral laminate.

(a2) is a step of removing the carrier layer alone.

The above steps (a1) and (a2) are the substitute for the step (a) described above. The copper foil treated in the step (a) may give way or wrinkle in the course of handling when the foil is very thin, so that a composite metal foil composed of a thin copper foil and a carrier layer is used to facilitate handling of the foil, and after laminating the foil on an interlayer circuit board, the carrier layer alone is separated away and the thin copper foil is subjected to circuit working. This allows finer working of the circuit conductors.

Steps (a3), (a4) and (a5)

(a3) is a step of compounding the electrically insulating ceramic whiskers in a thermosetting resin, dispersing the whiskers in the resin uniformly by stirring, coating the resulting mixture on the roughened surface of the first copper layer of a composite metal foil composed of a circuit-forming 1–9 $\mu$m thick first copper layer having an appropriate roughness for bonding with the resin, a 10–150 $\mu$m thick second copper layer having a sufficient strength for handling as a metal layer as a whole and a 0.04–1.5 $\mu$m thick nickel-phosphorus alloy layer interposed between said two copper layers, semi-curing the resin by heating to form a thermosetting resin layer, placing this thermosetting resin layer on an interlayer circuit board in which the plated through-holes and conductor circuits have been formed, and hot pressing them to form an integral laminate.

(a4) is a step of removing the second copper layer alone.

(a5) is a step of removing the nickel-phosphorus alloy layer alone.

In this step, in order to prevent scratching or other damage and adhesion of foreign matter on the copper foil surface during handline of the thin copper foil having a physically separable carrier layer, there is used a composite metal foil with a high degree of attachment which includes a metal layer having the different chemical conditions from the circuit conductors for the removal of the carrier. Since an increase of thickness of such a metal layer is uneconomical and also necessitates prolongation of the production process, this metal layer is used as an intermediate layer at the position where etching is to be ended.

A solution containing chlorine ions, ammonium ions and copper ions (this solution being hereinafter referred to as "alkali etchant") is used for etching away the second copper layer alone. For this treatment, the layer is contacted with the solution by a suitable means such as dipping or spraying.

In the step of removing the nickel-phosphorus alloy layer alone, the layer is dipped in an aqueous solution principally composed of nitric acid and hydrogen peroxide and also containing as additives an organic acid having one or more carboxyl groups and a heterocyclic compound containing nitrogen in the form of —NH— or —N= as a ring-forming member, or such a solution is sprayed to the layer.

Step (b)

This is a step of forming an etching resist on said copper foil and etching the copper foil portions exposed from the etching resist into the shape of holes for forming IVH.

In this step, the exposed copper foil portions can be etched away into the shape of holes for forming IVH by the the same method as commonly used for forming circuit conductors on a circuit board. The etching resist can be formed by a method in which a resist ink is printed on the copper foil surface by using silk screen printing technique, or a method in which a resist film is laminated on the copper foil surface and ultraviolet rays are applied thereto through a photomask so that the circuit portion alone will be left.

For etching away the copper foil portions exposed from the etching resist, said copper foil portions are contacted with a chemical etching solution to selectively remove said portions. A cupric chloride solution, a ferric chloride solution or the like can be used as the chemical etching solution.

Step (c)

A step of removing the etching resist.

In this step, the etching resist used in the preceding step is removed by a chemical means, usually using a solvent or an alkali solution.

Step (d)

A step of applying laser beams to the thermosetting resin layer exposed from the fine holes of the copper foil etched away into the shape of holes for forming IVH to remove said resin layer until the circuit conductors on the interlayer circuit board are exposed out, thereby forming the via holes.

The types of laser usable in this step include carbon dioxide laser, YAG laser, excimer laser, etc., of which carbon dioxide laser is preferred in view of productivity. Laser beam irradiation is preferably conducted with a laser oscillator which is capable of short-time, high-output pulse oscillation, for example, a laser pulse oscillator which can develop an output that allows hole forming at a rate of 2–5 pulses under the conditions of pulse width=1–40 μsec; pulse repetition frequency=150–10,000 Hz; pulse repetition rate= 1–10 pulses. This type of laser oscillator is preferred because of easy control of oscillation. The above oscillator output, when converted to energy density, falls in the range of 15–40 J/cm$^2$.

When the output per unit time is below the above-defined range, it is impossible to evaporate and disperse the resin layer, and when the output exceeds the above range, the hole diameter may become greater than necessary and is difficult to control, and also the resin which has been once evaporated may be carbonized and deposit on the board, making it necessary to perform an operation for removing the deposited carbide.

Step (e)

This is a step of roughening the cured thermosetting resin layer on the via hole wall surfaces with a roughening agent.

Any of the conventional roughening agents capable of swelling or dissolving the resin can be used, but usually an alkaline permanganic acid solution is preferably used.

Step (f)

A step of carrying out plating for electrically connecting the circuit conductors in the interlayer circuitboard to the copper foil.

Plating in this step is carried out by using the same technique as usually employed for through-hole plating of the circuit boards. Specifically, a material which becomes the nucleus of plating, such as palladium, is deposited on the roughened resin layer and the layer is contacted with an electroless plating solution comprising an ionized plating metal, a plating metal complexing agent and a plating metal reducing agent to effect plating of said nucleus material, with additional plating being conducted thereon, so that the plating metal will be deposited over the entire hole walls coated with the nucleus material. This plating establishes electrical connections of the outer layer copper foil, IVH wall surfaces and interlayer circuits.

Step (g)

A step of forming an etching resist on the copper foil and etching away the copper foil portions exposed from the etching resist.

In this step, the outer layer circuits are formed in the same way as in the step (b).

Step (h)

A step of removing the etching resist.

The etching resist is removed in the same way as in the step (c).

The present invention is further illustrated by the following Examples, in which all "parts" and "percents (%)" are by weight unless otherwise noted.

EXAMPLE 1

Step (a3)

A 0.6 mm thick glass cloth-epoxy resin impregnated double-sided copper-clad laminate MCL-E-679 (a trade name, mfd. by Hitachi Chemical Co., Ltd) was subjected to drilling and electroless copper plating and then further worked according to the conventional subtraction method to make an interlayer board 1 having through-holes 101 as shown in FIG. 1A.

Figure 1B:
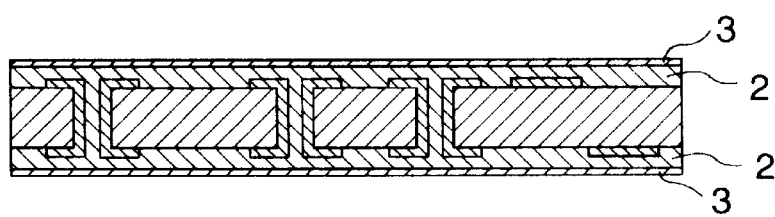

Then aluminum borate whiskers were mixed in an amount of 30 vol % in a thermosetting resin varnish of the composition shown below and stirred, and the mixture was coated on the first copper layer surface of a composite metal foil 3 comprising a 5 μm thick first copper layer, a 0.2 μm thick nickel-phosphorus alloy layer and a 15 μm thick second copper layer by using a knife coater and dried at 150° C. for 10 minutes to form a copper-foiled adhesive film having a semi-cured 50 μm thick thermosetting resin layer 2 as shown in FIG. 1B.

Composition of thermosetting resin varnish

| | |
|---|---|
| Bisphenol A novolak epoxy resin (epoxy equivalent: 200) | 100 parts |
| Bisphenol A novolak resin (hydroxy equivalent: 106) | 60 parts |
| 2-Ethyl-4-methylimidazole (curing agent) | 0.5 part |
| Methyl ethyl ketone (diluting solvent) | 100 parts |

The thus produced interlayer board 1 and copper-foiled adhesive film were placed one on the other so that the circuit conductors of the interlayer board 1 would contact the thermosetting resin layer 2 of the adhesive film, and hot pressed at 170° C. under 2.5 MPa for 60 minutes to form an integral laminate. The resin flow in this operation was 3 mm.

Step (a4)

The second copper layer alone was etched away with an alkali etchant of the following composition.

Compostion of the alkali etchant

| | |
|---|---|
| Cu | 175 g/l |
| $NH_4OH$ | 154 g/l |
| $NH_4Cl$ | 236 g/l |
| Liquid temperature: 50° C. | |

Step (a5)

The nickel-phosphorus alloy layer alone was etched away with an etching solution of the following composition.

Compostion of the etching solution

| | |
|---|---|
| Nitric acid | 200 g/l |
| Hydrogen peroxide (35%) | 10 ml/l |
| An organic acid containing carboxyl groups (DL malic acid) | 100 g/l |
| Benzotriazole | 5 g/l |

Step (b)

Figure 1C:
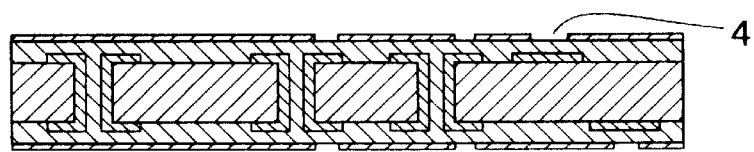

An etching resist was formed on said first copper foil by Dry Film Photec H-K 425 (a trade name, mfd. by Hitachi Chemical Co., Ltd.) and the copper foil portions exposed from the etching resist were etched away into the shape of 100 μm-diameter circles to provide the openings 4 of the copper foil for forming the via holes as shown in FIG. 1C.

Step (c)

The etching resist was removed by a 40° C. and 2-minute treatment with a 2 wt % NaOH solution.

Step (d)

Figure 1D:
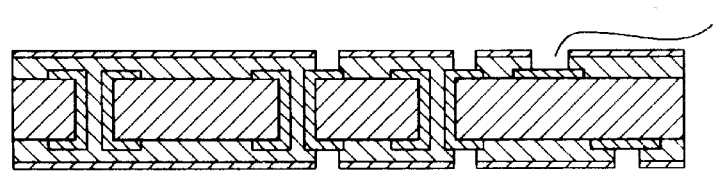

The cured thermosetting resin layer 2 exposed from the openings 4 of the copper foil was irradiated with carbon dioxide laser beams under the conditions of energy density of 20 J/cm$^2$, oscillation time of 1 μsec, oscillation frequency of 150 Hz and repetition pulse rate of 4 pulses to remove the resin layer until the circuit conductors in the interlayer board were exposed, thereby forming the via holes 5 as shown in FIG. 1D.

Step (e)

The cured thermosetting resin layer on the via hole wall surfaces was roughened by treating it with a 7% alkaline permanganic acid solution at a liquid temperature of 70° C. for 5 minutes.

Step (f)

Plating was carried out at a liquid temperature of 70° C. with an electroless plating solution of the following composition for electrically connecting the circuit conductors of the interlayer board and the copper foil.

Composition of the electroless plating solution

| | |
|---|---|
| $CuSO_4.5H_2O$ | 10 g/l |
| EDTA.4Na | 40 g/l |
| 37% HCHO | 3 ml/l |
| NaOH | amount required for making pH 12.3 |

Step (g)

An etching resist was formed on the copper foil by Dry Film Photec H-W 440 (a trade name, mfd. by Hitachi Chemical Co., Ltd.), and the copper foil portions exposed from the etching resist were removed.

Step (h)

Figure 1E:
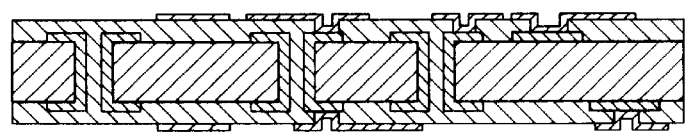
Figure 1F:
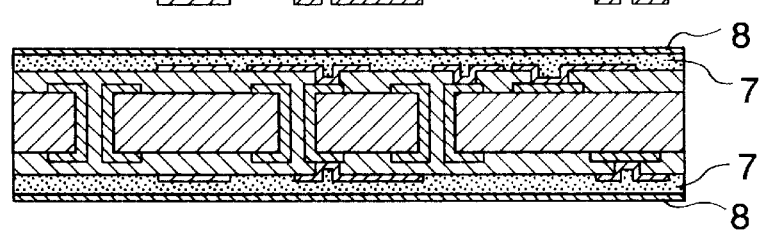
Figure 1G:
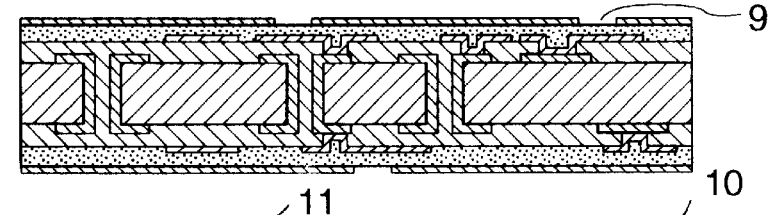

The etching resist was removed as shown in FIG. 1E.

Step (i)

Figure 1H:
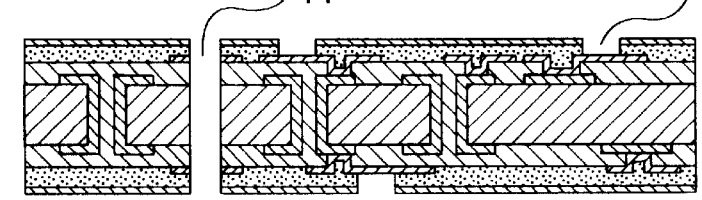
Figure 1I:
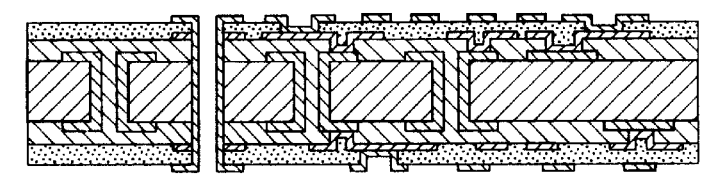

The above steps (a3) to (h) were carried out repeatedly as shown in FIGS. 1F, 1G, 1H and 1I, in which numeral 7 indicates the thermosetting resin layers, numeral 8 the copper foils, and numeral 9 the openings in the copper foils. By applying laser beams, the resin layers were removed to the extent that the circuit conductors on the interlayer board would be exposed to form via holes 10, and then the holes designed to serve as through-holes 11 were formed as shown in FIG. 1H, followed by roughening in the same way as in the step (e).

Further, a solder resist 16 was formed and electroless nickel plating was carried out on the bonding pads with a plating solution of the following composition at a liquid temperature of 90° C. for 12 minutes. The plating thickness was 5 μm.

Composition of electroless nickel plating solution

| | |
|---|---|
| Nickel sulfate | 30 g/l |
| Sodium hypophosphite | 10 g/l |
| Sodium acetate | 10 g/l |
| pH: 5 | |

Then electroless gold plating was carred out with a coating solution of the following composition at a liquid temperature of 90° C. for 7 minutes to provide a 0.5 μm thick gold plating.

Composition of electroless gold plating solution

| | |
|---|---|
| Potassium gold cyanide | 2 g/l |
| Ammonium chloride | 75 g/l |
| Sodium citrate | 50 g/l |
| Sodium hypophosphite | 10 g/l |

EXAMPLE 2

The procedure of Example 1 was carried out except that the aluminum borate whiskers were mixed in an amount of 10 vol % with the thermosetting resin varnish.

Laser drilling was conducted using carbon dioxide laser under the conditions of energy density=20 J/cm$^2$; oscillation time=1 μsec; oscillation frequency=150 Hz; pulse number=3.

EXAMPLE 3

The procedure of Example 1 was followed except that the aluminum borate whiskers were mixed in an amount of 45 vol % with the thermosetting resin varnish.

Laser drilling was carried out using carbon dioxide laser under the conditions of energy density=20 J/cm$^2$; oscillation time=1 μsec; oscillation frequency=150 Hz; pulse number=5.

EXAMPLE 4

The procedure of Example 1 was followed except that the steps (a3) to (a5) were replaced by the following steps (a1) and (a2).

Step (a1)

A 0.6 mm thick glass cloth-epoxy resin impregnated double-sided copper-clad laminate MCL-E-679 (a trade name, mfd. by Hitachi Chemical Co., Ltd.) was drilled and subjected to electroless copper plating, followed by working according to the conventional subtraction method to make an interlayer circuit board 1.

The aluminum borate whiskers were mixed in an amount of 30 vol % with a thermosetting resin varnish of the following composition and stirred, and the resulting mixture was knife coated on the thin copper layer side of a composite metal foil composed of a 5 $\mu$m thick copper layer and a 70 $\mu$m thick carrier copper layer, and dried at 150° C. for 10 minutes to make a semi-cured adhesive film having a copper foil.

Composition of the thermosetting resin varnish

| | |
|---|---|
| Bisphenol A novolak epoxy resin (epoxy equivalent: 200) | 100 parts |
| Bisphenol A novolak resin (hydroxy equivalent: 106) | 60 parts |
| 2-Ethyl-4-methylimidazole (curing agent) | 0.5 part |
| Methyl ethyl ketone (diluent) | 100 parts |

The thus produced interlayer board 1 and copper-foiled adhesive film were placed one on the other so that the circuit conductors of the interlayer board 1 would contact the thermosetting resin layer of the adhesive film, and they were hot pressed at 170° C. under a pressure of 2.5 MPa for 60 minutes to form an integral laminate. The resin flow in this operation was 5 mm.

Step (a2)

The carrier layer alone was stripped off.

Comparative Example 1

The following prepreg was used in place of the copper-foiled adhesive in Example 1.

(Prepreg)

Composition of the thermosetting resin varnish

| | |
|---|---|
| Bisphenol A novolak epoxy resin (epoxy equivalent: 200) | 100 parts |
| Bisphenol A novolak resin (hydroxy equivalent: 106) | 60 parts |
| 2-Ethyl-4-methylimidazole (curing agent) | 0.5 parts |
| Methyl ethyl ketone (diluent) | 100 parts |
| Glass cloth | |

Comparative Example 2

A thermosetting resin varnish of the following composition was used in place of the copper-foiled adhesive in Example 1.

Composition of the thermosetting resin varnish

| | |
|---|---|
| Bisphenol A novolak epoxy resin (epoxy equivalent: 200) | 100 parts |
| Bisphenol A novolak resin (hydroxy equivalent: 106) | 60 parts |
| 2-Ethyl-4-methylimidazole (curing agent) | 0.5 part |
| Methl ethyl ketone (diluent) | 100 parts |

Comparative Example 3

A thermosetting resin varnish of the following composition was directly coated on the interlayer board 1 by the silk screen printing method, then a copper foil was laid thereon and they were hot pressed to form an integral laminate, and this laminate was used in place of the copper-foiled adhesive in Example 1.

Thermosetting resin varnish composition

| | |
|---|---|
| Bisphenol A novolak epoxy resin (epoxy equivalent: 200) | 100 parts |
| Bisphenol A novolak resin (hydroxy equivalent: 106) | 60 parts |
| 2-Ethyl-4-methylimidazole (curing agent) | 0.5 part |
| Methyl ethyl ketone (diluent) | 100 parts |

The substrates manufactured in the manner described above were subjected to the following test. The test results are shown in Table 1.

TEST

Wire bonding workability

Figure 2:
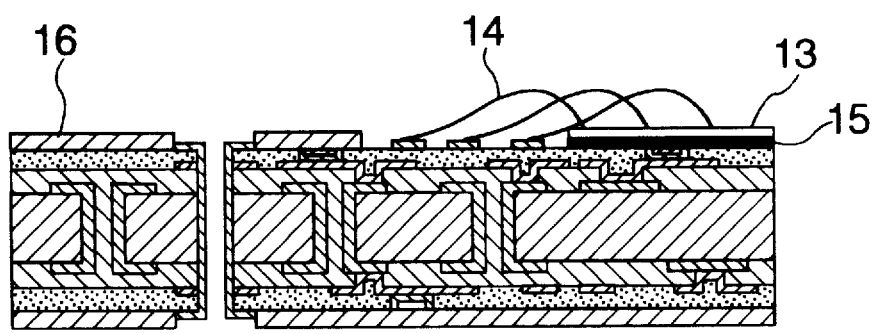
FIG. 2 is a schematic sectional view of an example of multilayer printed circuit board produced from the process of the present invention.

As shown in FIG. 2, IC chips 13 were secured to each test substrate by using a die bonding agent 15 and then they were wire bonded with 28 $\mu$m-diameter gold wires 14 by using a wire bonder HW22U-H (trade name, mfd. by Kyushu Matsushita Electric Industrial Co., Ltd.) at the substrate heating temperatures of 150° C. and 200° C.

Tensile strength of the wire bonded gold wires was measured by a pull tester PTR-01 (a trade name, mfd. by RHESCA Co., Ltd.). The results are shown in Table 1.

TABLE 1

| | Wire bonding workability | |
|---|---|---|
| | 150° C. | 200° C. |
| Example 1 | ◯ | ◉ |
| Example 2 | ◉ | ◯ |
| Example 3 | ◉ | ◉ |
| Example 4 | ◯ | ◉ |
| Comp. Example 1 | ◯ | ◯ |
| Comp. Example 2 | X | X |
| Comp. Example 3 | Δ | X |

X: could not be bonded
Δ: less than 4 g
◯: 4–10 g
◉: above 10 g

As described above, there is provided according to the present invention a process for producing a multilayer printed circuit board which is small in interlayer thickness, capable of fine wiring, minimized in IVH and BVH diameters, high in strength and also excellent in wire bonding workability.

What is claimed is:

1. A process for producing a multilayer printed circuit board comprising the following steps (a)–(h) which are carried out in this order:
    (a) compounding electrically insulating ceramic whiskers in a thermosetting resin varnish, dispersing the whiskers in the varnish uniformly by stirring, coating the resulting mixture on a roughened side of a copper foil, semi-curing the resin by heating to form a thermosetting resin layer, placing this layer on an interlayer circuit board in which plated through-holes and conductor circuits have been formed, and hot pressing them to form an integral laminate;
    (b) forming an etching resist on said copper foil, and etching the copper foil portions exposed from the etching resist into the shape of holes for forming interstitial via holes;

(c) removing the etching resist;

(d) applying laser beams to the cured thermosetting resin layer exposed from the fine holes of the copper foil etched into the shape of holes for forming interstitial via holes to remove said resin layer to an extent that the circuit conductors of the interlayer board is to be exposed, thereby forming via holes;

(e) roughening said cured thermosetting resin layer on the walls of said via holes by using a roughening agent;

(f) conducting plating to electrically connect the circuit conductors of the interlayer board and the copper foil;

(g) forming an etching resist on said copper foil and etching away the copper foil portions exposed from said etching resist; and (h) removing the etching resist.

2. A process according to claim 1, wherein the following steps (a1) and (a2) are used in place of the step (a):

(a1) compounding electrically insulating ceramic whiskers in a thermosetting resin varnish, dispersing the whiskers in the varnish uniformly by stirring, coating the resulting mixture on a roughened side of a copper layer of a composite metal foil comprising a circuit-forming copper layer having an appropriate roughness for bonding with the resin and a carrier layer having a sufficient strength to stand handling as a metal layer as a whole, said two layers being easily separable from each other, semi-curing the resin by heating to form a thermosetting resin layer, placing this resin layer on an interlayer circuit board in which the plated through-holes and conductor circuits have been formed, and hot pressing them to form an integral laminate; and (a2) removing the carrier layer alone.

3. A process according to claim 1, wherein the following steps (a3) to (a5) are used in place of the step (a):

(a3) compounding electrically insulating ceramic whiskers in a thermosetting resin varnish, dispersing the whiskers in the varnish uniformly by stirring, coating the resulting mixture on a roughened side of a first copper layer of a composite metal foil comprising a circuit-forming 1–9 $\mu$m thick first copper foil having an appropriate roughness for bonding with the resin, a 10–150 $\mu$m thick second copper layer having a sufficient strength to stand handling as a metal layer as a whole and a 0.04–1.5 $\mu$m thick nickel-phosphorus alloy layer disposed between said first and second copper layers, semi-curing the resin by heating to form a thermosetting resin layer, placing this resin layer on an interlayer circuit board in which the plated through-holes and conductor circuits have been formed, and hot pressing them to form an integral laminate;

(a4) removing the second copper layer alone; and (a5) removing the nickel-phosphorus alloy layer alone.

4. A process according to any one of claims 1–3, wherein the steps of (a) to (h), (a1) to (h), or (a3) to (h) are repeated a necessary number of times to form two or more layers of via holes.

5. A process according to any one of claims 1–3, wherein the thermosetting resin flow is 500 $\mu$m or greater, and the thickness of the semi-cured thermosetting resin layer is 25 to 100 $\mu$m.

6. A process according to any one of claims 1–3, wherein the amount of the electrically insulating whiskers compounded in the thermoseting resin is 5 to 50% by volume.

7. A process according to claim 4, wherein the thermosetting resin flow is 500 $\mu$m or greater, and the thickness of the semi-cured thermosetting resin layer is 25 to 100 $\mu$m.

8. A process according to claim 4, wherein the amount of the electrically insulating whiskers compounded in the thermosetting resin is 5 to 50% by volume.

* * * * *